Jan. 18, 1944. B. RUDNICK Re. 22,421

PHOTOMECHANICAL NEGATIVE

Original Filed May 21, 1941

INVENTOR.
Benjamin Rudnick
BY
Robert C. Rasche,
His Attorney.

Reissued Jan. 18, 1944

Re. 22,421

UNITED STATES PATENT OFFICE 22,421

PHOTOMECHANICAL NEGATIVE

Benjamin Rudnick, Huntington, N. Y., assignor to Republic Aviation Corporation, Farmingdale, N. Y., a corporation of Delaware Original No. 2,321,046, dated June 8, 1943, Serial No. 418,435, November 10, 1941, which is a division of Serial No. 394,403, May 21, 1941. Application for reissue October 2, 1943, Serial No. 505,561

8 Claims. (Cl. 41—46)

This invention relates to the preparation of a photo-mechanical negative to be used for the photo-mechanical reproduction of drawing sheets, mechanical layouts, templates, etc.

The invention aims to provide a photo-mechanical negative which can be used in connection with the method of reproduction disclosed in my co-pending application, Serial No. 394,403, filed May 21, 1941, of which the present application is a division.

More particularly the invention aims to provide a negative for reproduction by which inscriptions, for example, line drawings, luminescently produced upon the negative may be transferred to another surface, which has previously been rendered light-sensitive by momentarily placing the two surfaces in contact with each other to cause exposure of the sensitized surface by the luminescent inscriptions.

According to one of the preferred modes of carrying out this method, a stiff backing sheet or plate is coated with a layer of luminescent material having an overcoating of opaque masking material, the layers of luminescent and masking materials constituting what, for convenience, I term a "negative surface." The copy sheet to which the design is to be transferred is coated with a film of light-sensitive emulsion so as to form what may be referred to as a positive surface. The drawing to be reproduced is made upon the negative surface by means of a stylus or other pointed instrument which cuts or scratches through the overcoating of opaque masking material, and uncovers the luminescent material. After presenting the negative surface to a bright light, either natural or artificial, to excite the uncovered luminescent material, the treated surfaces are superimposed to allow the light rays emitted by the uncovered luminescent material to act upon the light-sensitive film. Finally the copy sheet is developed and fixed in the usual photographic solutions to reduce the exposed areas to visible metallic silver, leaving these areas black and clear-cut, and corresponding exactly to the lines of the original drawing.

The use of this negative is not limited to this method of reproduction of drawings upon sheet material, and will indeed find great utility in machine and sheet metal shop practice in transferring mechanical layouts or templates as they come from the drafting table directly onto the work to be machined, metalsmithed or otherwise operated upon.

Another object of the invention is to provide a photo-mechanical negative on which any kind of line drawings may be readily marked, corrected or completed by means of a stylus so as to form a master pattern which may be repeatedly used for the preparation of new drawings or the localized correction of old drawings.

Other objects and advantages will be apparent from the following detailed description of two preferred modes of realization of my invention, reference being had to the annexed drawing in which:

Figures 1 to 4 refer to the first mode;

Figure 1:
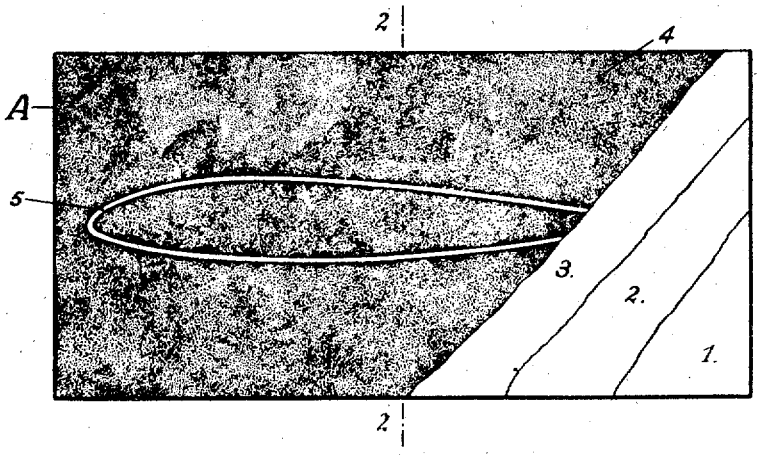
Figure 1 is a plan view of a negative or pattern sheet having a drawing inscribed thereon.
Figure 2:
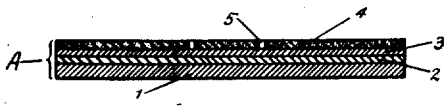
Figure 2 is a cross-sectional view of the pattern sheet taken on the line 2—2 of Figure 1, the coating layers being shown, for greater clearness, somewhat exaggerated in thickness.

In Figures 1 and 2 of the drawing is illustrated a photo-mechanical negative or pattern sheet A comprising a backing sheet 1, which may be composed of paper, cardboard, metal, or any other suitable material. One surface of the backing sheet is thoroughly cleaned to free it from dirt, grease, or oil, following which a thin coating of white paint 2, containing no lead compounds, is applied over the surface. Upon the coating of white paint is deposited, either by a spray or a brush, a layer of a luminescent composition 3 suspended in a transparent vehicle. For this luminescent composition I prefer to use the reaction product resulting from igniting a mixture of calcium carbonate and sulphur together with small quantities of bismuth or manganese salts, this reaction product being suspended in a vehicle of unpigmented nitrocellulose lacquer thinned to a suitable consistency.

After allowing the luminescent composition to dry so that it is no longer tacky but firm and hard, a thin coating of opaque masking material 4 is evenly distributed over its surface, so as to completely cover the luminescent layer. This masking material may comprise a black lacquer such as is compatible with the lacquer vehicle containing the luminescent composition.

The layer of luminescent material overlain by the coating of masking material constitutes a negative surface upon which, after drying, a drawing 5 may be inscribed by means of a stylus or other pointed instrument, which cuts through the overcoating of masking material and bares the luminescent composition underneath. Because of the fact that the masking material adheres as an extremely thin coating to the luminescent composition, it may be readily penetrated by the usual drafting instruments, such as a pen or compass, provided with a stylus point, and calls for no materially different technique on the part of the draftsman from what is involved in the preparation of the usual mechanical drawings. Since the translucent nitrocellulose vehicle carrying the luminescent composition is superimposed upon the white undercoating of paint 2, the lines produced by the stylus stand out sharply and clean-cut against the black background of the masking material. Should the draftsman make a mistake in initially laying out the drawing, this may be readily corrected by painting over, and thus blacking out the incorrectly placed lines with a black lacquer corresponding in composition to that of the masking material, the correct lines afterwards being added when the lacquer has dried.

Figure 3:
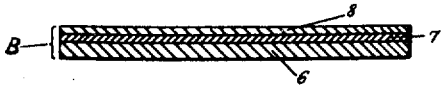
Figure 3 is a cross-sectional view of a copy sheet, which is preferably used in combination with this negative according to the method of reproduction disclosed in the above-mentioned co-pending application, and Figure 4 indicates the manner in which the negative and this copy sheet are arranged during their exposure.

The thus-prepared sheet is now placed in a strong light, which may be either natural sunlight or artificial light, for example, ultra-violet light, the purpose of which is to excite the luminescent composition uncovered by the stylus so that it gives off radiations in a dark room. Only a few minutes is required for such excitation, following which the pattern sheet is ready for use as a master negative from which reproductions of the drawing may be photographically transferred to copy sheets, one of such copy sheets designated B, being shown in cross-section in Figure 3.

The copy sheet B comprises a backing sheet 6 of metal, fabric, paper, glass, synthetic plastic, wood, or any other suitable material, or it may constitute the actual work to be operated upon. One face of the backing sheet is cleaned. A coating of priming material 7 is then painted or sprayed over the cleaned surface, the primer serving both as a filler for closing the pores of the material composing the backing sheet, and as a protective shield between the backing sheet and the emulsion which is subsequently applied thereto, and which otherwise might interact chemically with the backing material. I prefer to use as the primer a suspension of zinc chromate in a carrier selected with consideration to the nature of the material composing the backing sheet. When the backing sheet is composed of a metal such as steel, both of its faces, as well as its edges, will be covered with the primer to avoid contamination of the chemicals employed in the subsequent developing operation.

The copy sheet is next placed in a dark room illuminated, for example, by a ruby safelight of the type well known to photography; the temperature is maintained substantially constant and an emulsion 8, consisting for example, of a light-sensitive material, such as silver nitrate suspended in a gelatinous vehicle, is melted and applied as a film in any suitable manner giving an even thickness, though I prefer to apply it with a low-pressure spray gun smoothly and uniformly over the primer coating. The thus-prepared sheet is then passed through a chilling chamber causing the emulsion to jell, after which it is placed in a dryer.

The prepared copy sheet B may be used as soon as it is dry, or it may be stored away in a light-tight cabinet for future use. In transferring the drawing from the negatively prepared surface of pattern sheet A to the positively prepared surface of the copy sheet B, the pattern sheet is placed upon a flat, solid support in a dark room, treated face up, and the copy sheet is superimposed upon the pattern sheet with its treated face held firmly in engagement with the treated face of the pattern sheet to insure absolute contact therebetween. Under such conditions, the light rays emitted by the uncovered luminescent composition act photographically upon the light-sensitive emulsion and cause the silver salts to be sufficiently affected usually in about one and one-half to two minutes. The thus-exposed copy sheet is finally removed and treated with the usual developing and fixing solutions in a manner which is well-known to the photographic art, and then washed and dried. Because the negative surface retains its luminescence for a considerable time, a great number of copies of the drawing may be reproduced therefrom in a single dark room operation; and when its luminosity becomes spent it can be restored by again presenting it to a strong light.

The drawing reproduced upon the copy sheet exhibits black, sharply-defined lines against the olive-green background of the primer coating, which is pleasing and restful to the eyes. If desired, however, the olive-green color may be bleached out to reveal the color of the backing sheet 6, by immersing the copy sheet in a dilute solution of ammonium hydroxide; or the copy sheet may be rendered transparent if glass or a transparent plastic is employed as the backing material.

If an aluminum alloy is used as the backing of the copy sheet, the light-sensitive emulsion can be applied directly on the metal by first cleaning the surface in a sodium hydroxide solution and then dipping in a diluted nitric acid bath to neutralize the caustic action.

The negative A is particularly useful for making templates. The drawing 5 indicated in Figure 1 represents a cross-section contour of an aircraft wing panel. By transferring this drawing to a sheet of metal or other rigid material in the manner already described, and then cutting along the lines of the reproduced drawing, a template corresponding to the contour of the original drawing is obtained.

Manifestly, the negative described above is susceptible of modification. While I have found that a luminescent composition incorporating the reaction product of burned calcium carbonate and sulphur, as above-described, gives excellent results besides being comparatively inexpensive to produce, nevertheless other compositions may be advantageously employed such, for example, as the phosphorus compounds. The coating of white paint 2 upon the pattern sheet may be omitted if desired, and the luminescent material applied directly to the backing sheet 1. However, the presence of this white substratum advantageously affects the results obtained, particularly in those cases where the layers of luminescent material is relatively thin, or where the character of the backing material is such as to absorb rather than to reflect transmitted light.

The pattern sheet may be repeatedly used for the preparation of new or corrected drawings simply by completely or partially blacking over its inscribed surface with a fresh coating of black lacquer. After the lacquer has dried, a new and different drawing, or a localized correction of an old drawing, may be inscribed upon the renewed surface, the procedure being otherwise the same as that described above.

Figure 5:
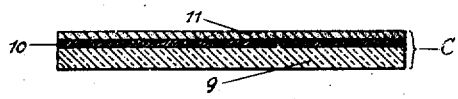
Figures 5 and 6 are views similar to Figures 2 and 4 respectively of the second mode.

Another mode of preparing a negative C which can be used to reproduce onto the same light-sensitive coated copy sheets as are used in the luminous mode may be carried out in the following manner (Figures 5 to 7): a clear plastic sheet .01 to .015 thick is seated with an opaque masking material consisting of two separate layers 10, 11 of a metallic lacquer. These layers of metallic lacquer are so applied that they can be scribed off or cut away, without scratching or cutting into the plastic backing sheet 9. The first coating 10 is prepared by mixing a quantity of finely ground aluminum powder in nitro-cellulose lacquer to form a thick paste. This is thinned with a mixture of solvents to a suitable consistency and is applied to the surface of the plastic sheet 9. This coating 10, when dry, renders the plastic material 9 opaque but can readily be removed with a few strokes of a stiff brush. The material for the second coating 11 is prepared by mixing a quantity of metallic powder, which consists mainly of tin, to a greater amount of nitro-cellulose lacquer than was used in the first coating 10. To this is added enough solvents to thin to the desired consistency and this is applied over the first layer 10. Upon drying, the second coating 11 acts as a binder for the first coating 10. The drawing to be reproduced (not shown) is drawn on this surface by means of a pointed instrument which cuts or removes the top layer 11 of masking material making it possible to brush out the aluminum powder 10 underneath, covering the transparent plastic backing 9. This is now used as a photographic negative C. It is, for instance, placed in contact with the light-sensitive copy sheet 6, 7, 8 and exposed to artificial light for a predetermined time. These light rays pass through the transparent portions of the plastic negative C, reacting on the light-sensitive salts of the copy sheet B. The exposed copy sheet B is then processed in the usual photographic solutions. The resulting reproduction appears as a sharply defined black line on a clean contrasting background.

Figure 6:
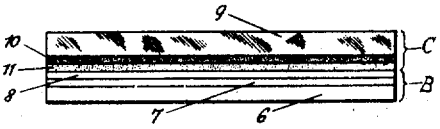
Figure 4:
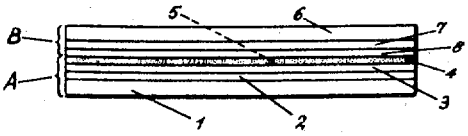
Figure 7:
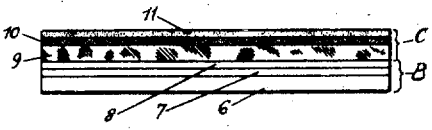
Figure 7 shows a different manner in which the negative and the copy sheet may be arranged during their exposure.

An outstanding advantage in the use of the plastic negative is the fact that either a right hand or left hand reproduction can be obtained accurately by merely placing the coated surface of the plastic negative C (to produce a copy in reverse of the design as drawn) in direct contact with the light-sensitive copy plate B (as shown in Figure 6) or by placing the back or uncoated surface of the plastic negative in contact with the light-sensitive copy plate (as shown in Figure 7).

Manifestly, various other modifications in the foregoing modes of preparing the photo-mechanical negative object of the present invention may be made by those skilled in the art without departing from the spirit of my invention as defined in the following claims.

I claim:

1. Photo-mechanical negative for reproducing designs comprising a backing member, a layer of a luminescent composition supported upon said backing member, and a coating of an opaque masking material overlying said layer of luminescent composition, said masking material being of a thickness and composition such as to be readily penetrable by a stylus.

2. Photo-mechanical negative for reproducing designs comprising a backing member, a layer of a luminescent composition supported upon said backing member comprising the reaction product resulting from burning a mixture of calcium carbonate and sulphur suspended in a resinous vehicle, and a coating of an opaque masking material overlying said layer of luminescent composition, said masking material being of a thickness and composition such as to be readily penetrable by a stylus.

3. Photo-mechanical negative for reproducing designs comprising a backing member, a layer of a luminescent composition supported upon said backing member comprising the reaction product resulting from burning a mixture of calcium carbonate and sulphur together with a relatively small amount of a bismuth salt suspended in a resinous vehicle, and a coating of an opaque masking material overlying said layer of luminescent composition, said masking material being of a thickness and composition such as to be readily penetrable by a stylus.

4. Photo-mechanical negative for reproducing designs comprising a backing member, a layer of a luminescent composition supported upon said backing member comprising the reaction product resulting from burning a mixture of calcium carbonate and sulphur together with a relatively small amount of a manganese salt suspended in a resinous vehicle, and a coating of an opaque masking material overlying said layer of luminescent composition, said masking material being of a thickness and composition such as to be readily penetrable by a stylus.

5. Photo-mechanical negative for reproducing designs comprising a backing member, a layer of a luminescent composition supported upon said backing member comprising the reaction product resulting from burning a mixture of calcium carbonate and sulphur suspended in a nitrocellulose lacquer vehicle, and a coating of black lacquer overlying said layer of luminescent composition, said black lacquer being of a thickness such as to be readily penetrable by a stylus.

6. Photo-mechanical negative for reproducing designs, comprising a backing sheet one face of which is thoroughly cleaned, a thin coating of white paint applied upon this cleaned face, a layer of a luminescent composition suspended in a transparent vehicle spread and dried upon this coating of white paint and a thin coating of an opaque masking material evenly distributed over the surface of this layer of luminescent composition.

7. A photo-mechanical negative for the reproduction of designs comprising a substantially smooth opaque backing member, and a design delineated in an inherently actinic ray emitting material adhered to the backing member.

8. A photo-mechanical negative for the reproduction of designs comprising a substantially smooth opaque backing member, and a design delineated in light-responsive, actinic ray emitting material adhered to the backing member.

BENJAMIN RUDNICK.